（12）United States Patent
Hoover

(10) Patent No.: US 7,710,177 B2
(45) Date of Patent: May 4, 2010

(54) LATCH DEVICE HAVING LOW-POWER DATA RETENTION

(75) Inventor: Andrew P. Hoover, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 105 days.

(21) Appl. No.: 11/854,088

(22) Filed: Sep. 12, 2007

(65) Prior Publication Data

US 2009/0066385 A1 Mar. 12, 2009

(51) Int. Cl.
*H03K 3/00* (2006.01)

(52) U.S. Cl. ........................................ 327/218; 327/199

(58) Field of Classification Search ................. None
See application file for complete search history.

(56) References Cited

U.S. PATENT DOCUMENTS

| 6,492,854 | B1 | 12/2002 | Ku et al. | |
|---|---|---|---|---|
| 6,965,261 | B2 * | 11/2005 | Tran et al. | 327/202 |
| 7,138,842 | B2 * | 11/2006 | Padhye et al. | 327/203 |
| 2004/0090256 | A1 | 5/2004 | Cho | |
| 2006/0109040 | A1 | 5/2006 | Clerc | |
| 2006/0197571 | A1 * | 9/2006 | Kim | 327/218 |
| 2006/0220700 | A1 | 10/2006 | Hoover et al. | |
| 2007/0176639 | A1 * | 8/2007 | Hoberman et al. | 326/93 |

* cited by examiner

*Primary Examiner*—Cassandra Cox

(57) ABSTRACT

A latch of an integrated circuit is able to retain data at the latch when the integrated circuit is in a low-power mode. The latch retains data at a retention stage in response to assertion of an isolation signal. In response to a reference voltage supplied to the latch being restored to a normal operating voltage, indicating that the integrated circuit has transitioned from the low-power mode to a normal mode, a data restoration circuit provides the retained data at the output of the latch prior to negation of the isolation signal. This reduces the likelihood that a delay in negation of the isolation signal will result in the latch output providing incorrect data, thereby reducing the likelihood of the latch output causing errors in downstream elements of the integrated circuit.

20 Claims, 7 Drawing Sheets

LATCH DEVICE HAVING LOW-POWER DATA RETENTION

FIELD OF THE DISCLOSURE

The present disclosure relates to integrated circuits and more particularly to latch devices of integrated circuits.

BACKGROUND

Integrated circuits typically employ latches to store data. Some latches are able to retain data when the integrated circuit enters a low-power mode. When the integrated circuit changes to a normal or active mode, the retained data is provided at the latch output in response to an isolation signal indicating the mode change. However, errors can result from imprecision in the timing of the isolation signal. For example, if a latch provides an asynchronous reset control signal to downstream elements, a delay in the isolation signal can cause an undesirable reset of the downstream elements. The likelihood of such errors can be reduced by individually controlling the timing of isolation signals for each latch in the integrated circuit. However, this can require an undesirable number of individually controlled isolation signals, and can also require undesirably complex circuitry to control each isolation signal. Accordingly, there is a need for an improved latch device.

BRIEF DESCRIPTION OF THE DRAWINGS

The present disclosure may be better understood, and its numerous features and advantages made apparent to those skilled in the art by referencing the accompanying drawings.

DETAILED DESCRIPTION

A latch of an integrated circuit is able to retain data at the latch when the integrated circuit is in a low-power mode. The latch retains data at a retention stage in response to assertion of an isolation signal. In response to a reference voltage supplied to the latch being restored to a normal operating voltage, indicating that the integrated circuit has transitioned from the low-power mode to a normal mode, a data restoration circuit provides the retained data at the output of the latch prior to negation of the isolation signal. This reduces the likelihood that a delay in negation of the isolation signal will result in the latch output providing incorrect data, thereby reducing the likelihood of the latch output causing errors in downstream elements of the integrated circuit.

Figure 1:
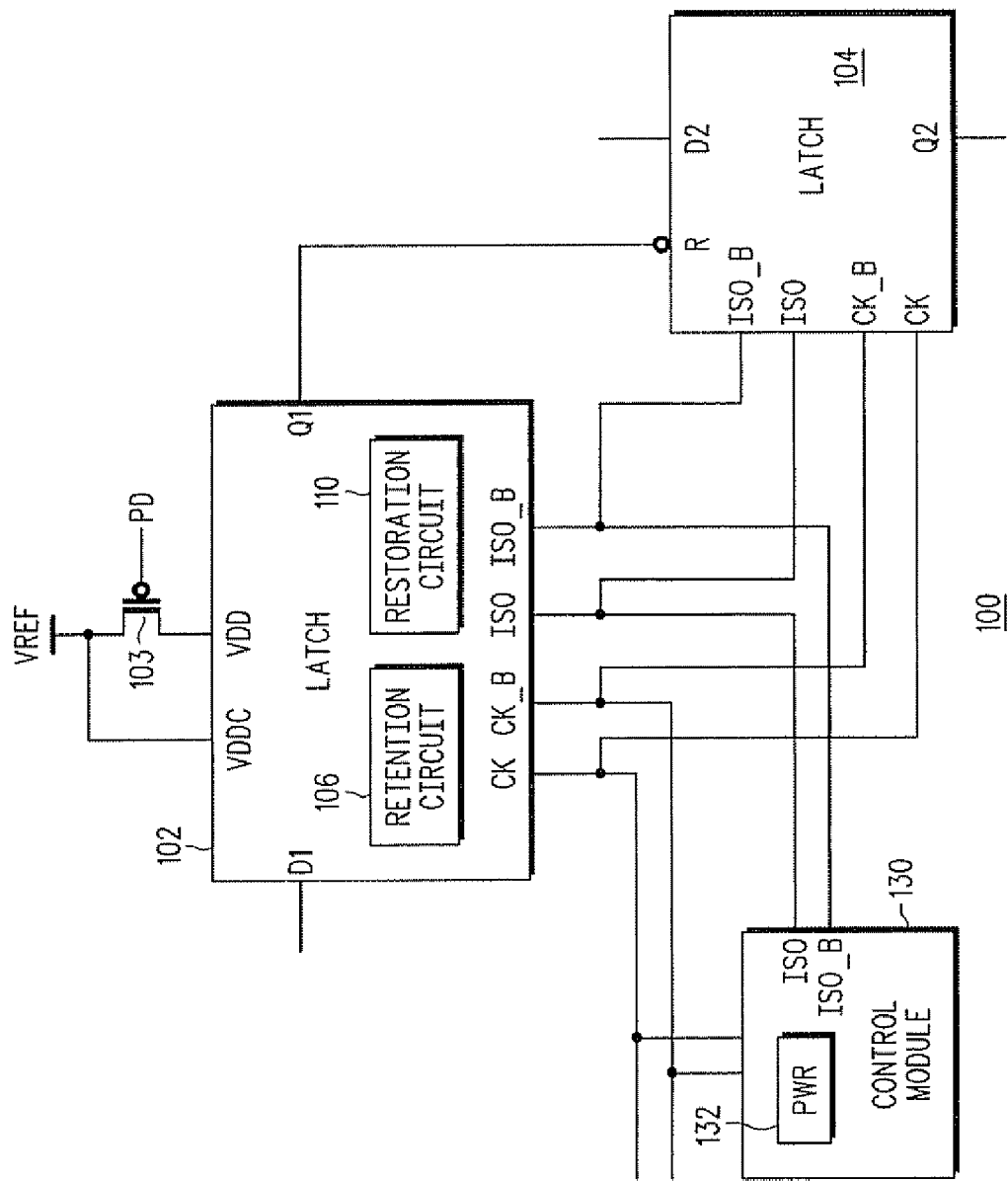
FIG. 1 is a combined block and circuit diagram of a particular embodiment of an integrated circuit device.

Referring to FIG. 1, a block and circuit diagram of an integrated circuit device 100 is shown. The integrated circuit device 100 can be a microprocessor, microcontroller, application specific integrated circuit (ASIC), and the like. The integrated circuit 100 is configured to operate in at least two modes: a normal mode (also referred to herein as an active mode) and a low-power mode. As used herein the term "normal mode" refers to a mode where the integrated circuit 100 is able to perform normal operations. The term "low-power mode" refers to a mode where the integrated circuit 100 cannot perform normal operations, but consumes less power than in the normal mode, including less leakage power. Accordingly, in the low-power mode the integrated circuit 100 may not be able to perform certain operations that can be performed in the normal mode.

The integrated circuit device 100 includes a latch 102, a latch 104, a switch comprising a transistor 103, and a control module 130. The latch 102 includes an input labeled "D1", a voltage reference input labeled "VDDC", a voltage reference input labeled "VDD", a clock input labeled "CK", a clock input labeled "CK_B", a control input labeled "ISO", a control input labeled "ISO_B", and an output labeled "Q1." The latch 102 also includes a retention circuit 106 and a restoration circuit 110. The latch 102 can be an edge-triggered device, such as a flip-flop, or a level sensitive device. In an alternative embodiment, the latch 102 does not include the ISO_B input, but instead inverts the signal provided at the ISO input locally. Similarly, in an alternative embodiment, the latch 102 does not include CK_B, but instead inverts the signal provided at the CK input locally. In addition, for purposes of discussion CK_B is assumed to be a complement of the signal CK, while the signal ISO_B is assumed to be a complement of the signal ISO.

The latch 102 is configured to receive reference voltages via the inputs VDDC and VDD. When the reference voltage at the input VDD is at an active level, indicating that the integrated circuit 100 is in the normal mode, the latch 102 is configured to store data at the input D1 of the latch 102 according to the timing of clock signals at the clock inputs CK and CK_B. The timing of these signals also determines when the stored data is provided at the output Q1 of the latch 102. In addition, the latch 102 is configured to retain the data stored at the latch at the retention circuit 106 when a signal received at the ISO input is asserted. The retention circuit 106 is configured to retain the data even when the voltage at the input VDD is at a lower than active level, indicating that the integrated circuit 100 has entered the low-power mode. The restoration circuit 110 is configured to provide the data retained at the retention circuit 106 to the output Q1 based on the state of the signal at the ISO input.

The latch 104 includes an input labeled "D2", a voltage reference input labeled "VDDC", a voltage reference input labeled "VDD", a clock input labeled "CK", a clock input labeled "CK_B", a control input labeled "ISO", a control input labeled "ISO_B", a control input labeled "R" connected to the output Q1 of the latch 102, and an output labeled "Q2." The latch 104 is configured to store data at the input D2 based on clock signals at the clock inputs CK and CK_B. The timing of these signals also determines when the stored data is provided at the output Q2 of the latch 104. In addition, the latch 104 is configured to reset the data stored at the latch to a reset state based upon the state of a signal received at the R input. In one embodiment, the R input is ignored when ISO is asserted. In a particular embodiment, the latch 104 is similar to the latch 102 and includes a retention circuit and restoration circuit.

The control module 130 includes outputs CLK, CLK_B, ISO, and ISO_B connected to the CK, CK_B. ISO, and ISO_B inputs, respectively, of both the latch 102 and the latch 104. The control module 130 also includes a register 132 that stores data indicating the power mode of the integrated circuit 100. The control module 130 is configured to provide clock signals via the CLK and CLK_B outputs to control operation of the latch 102 and the latch 104. The control module 130 is also configured to control signals at the ISO and ISO_B outputs based on the power mode indicated by the data stored at the register 132. For example, the integrated circuit 100 can indicate that it is entering a low-power mode by storing a particular value at the register 132. In response, the control module 130 can control the isolation signals at the ISO and ISO_B outputs to ensure that data at the latch 102 is stored in the retention circuit 106 prior to the integrated circuit 100 entering the low-power mode. Similarly, when the value stored at the register 132 indicates the integrated circuit 100 is returning to the active mode from the low-power mode, the control module 130 can control the isolation signals to ensure that normal operation of the latch 102 is resumed.

Figure 2:
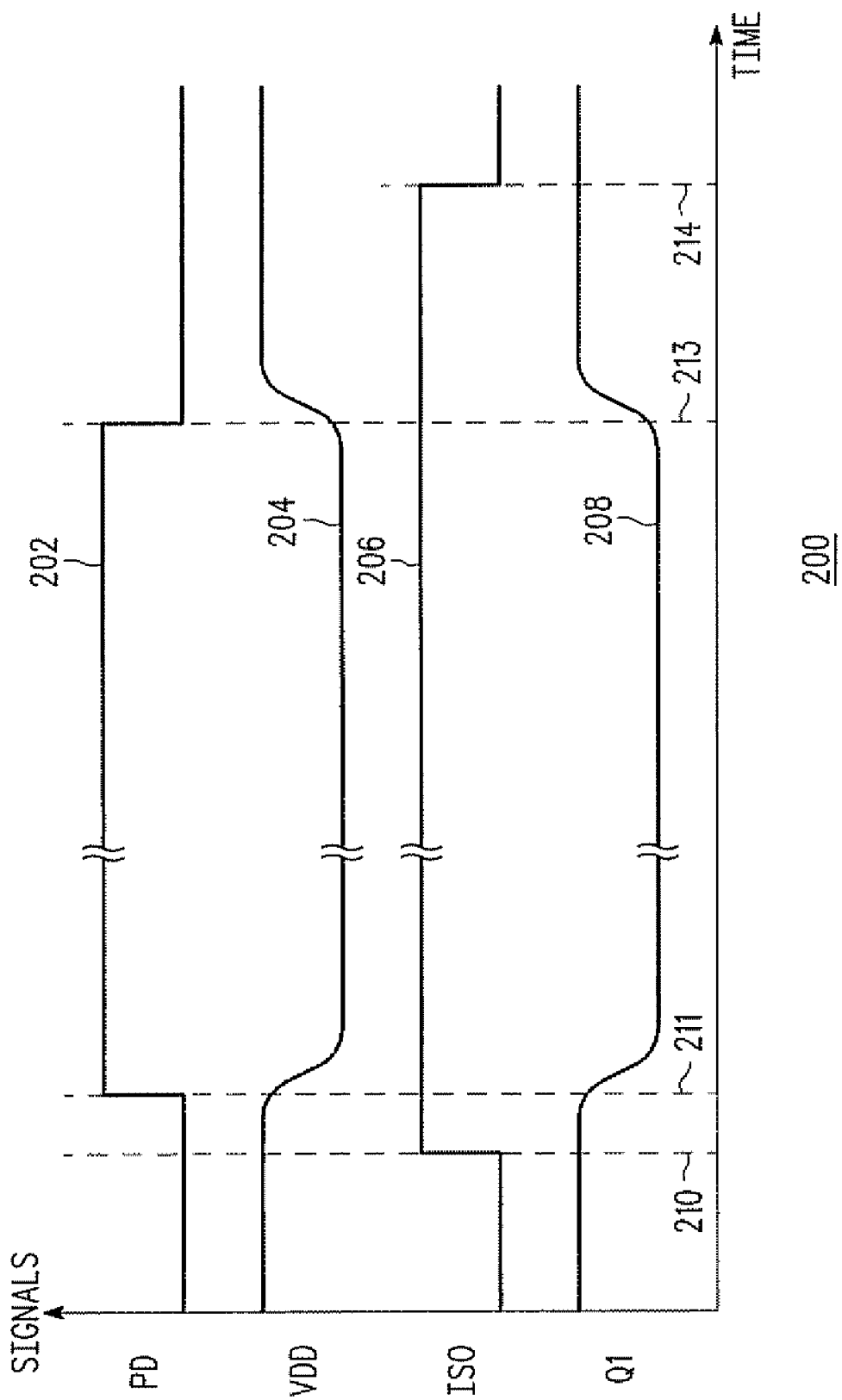
FIG. 2 is a diagram illustrating a particular embodiment of data and control signals for a latch of FIG. 1.

The operation of the integrated circuit 100 and the latch 102 may be better understood with reference to FIG. 2. FIG. 2 illustrates a diagram of a particular embodiment of signals associated with the latch 102. The curve 202 illustrates the state of a signal "PD" that indicates whether the integrated circuit 100 is in an active mode or a low-power mode. The curve 204 indicates the level of the voltage VDD. The curve 206 indicates the state of the isolation signal at the input ISO of the latch 102. The curve 208 indicates the state of the output Q1 of the latch 102.

In operation, at time 210 the isolation signal at the ISO input of the latch 102 is asserted, indicating that the data stored at the latch 102 should be retained at the retention circuit 106. As shown in curve 208, the data stored at the latch 102 at time 210 is a logic high. In response to assertion of the signal at the ISO input, the data stored at the latch is retained at the retention circuit 106 while the integrated circuit 100 is in the low-power mode. At time 211, the power down signal PD is asserted, indicating that the integrated circuit 100 is entering the low-power mode. Accordingly, in response to assertion of the power down signal, the transistor 103 becomes more non-conductive, causing the voltage at the input VDD to drop, as illustrated by the curve 204. This causes the data provided at the output Q1 to drop below a logic high, as illustrated by the curve 208.

At time 213, the power down signal PD is negated, indicating that the integrated circuit 100 is transitioning from the low-power mode to the active mode. In response to negation of the PD signal, the transistor 103 becomes more conductive and the voltage applied at the input VDD is increased to normal levels, as illustrated by the curve 204. As the input VDD is increased, the restoration circuit 110 restores the data stored by the retention circuit 106 to the output Q1, as illustrated by the curve 208. The output Q1 is restored to the retained data level prior to negation of the signal at the ISO input at time 214. This ensures that the data stored at the latch 104 is not erroneously reset by a delay in negation of the signal at the input ISO. Accordingly, the time of the ISO signal does not have to be controlled precisely to avoid an erroneous reset, thereby simplifying the design of the control module 130.

Figure 3:
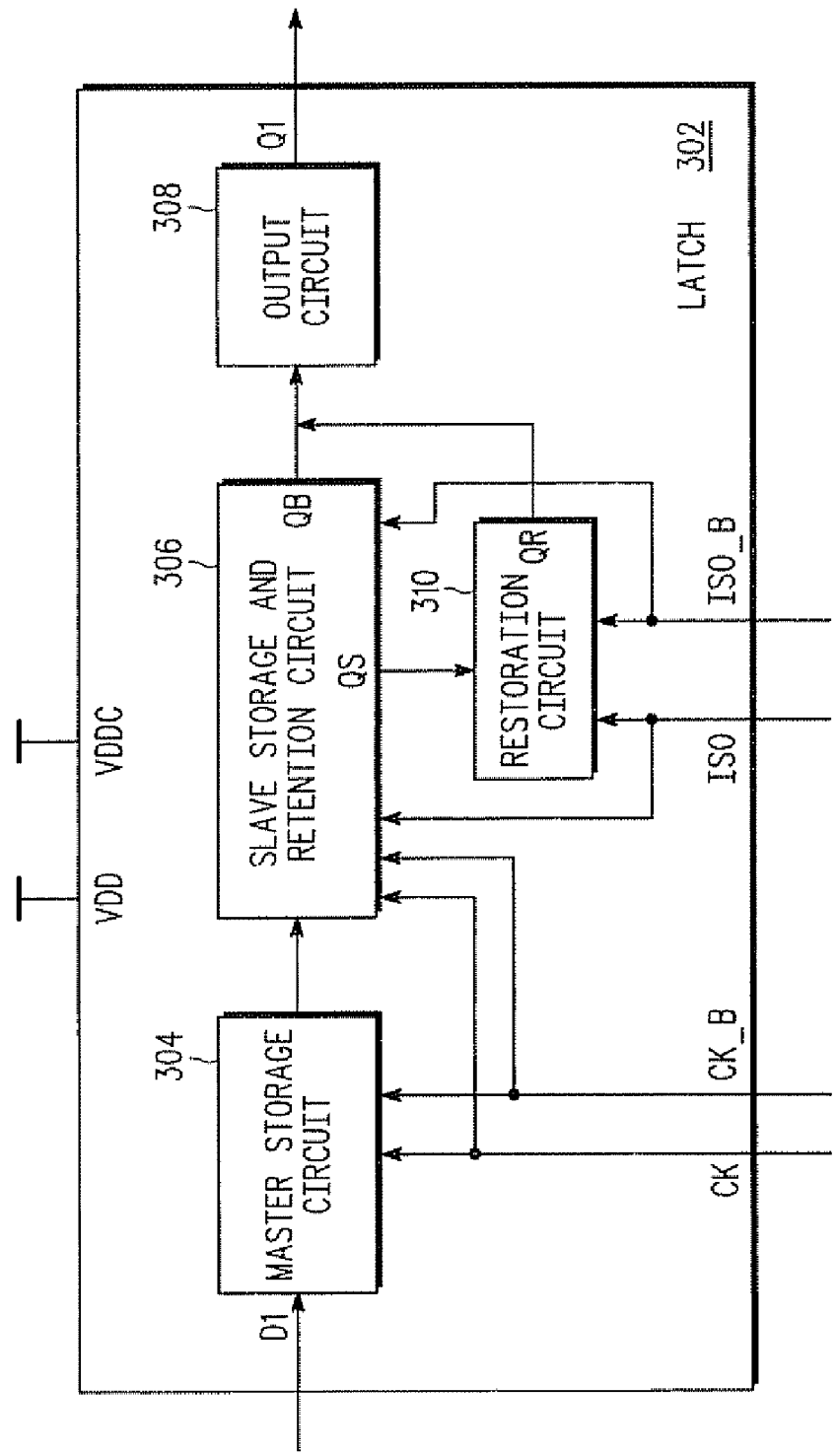
FIG. 3 is a block diagram of a particular embodiment of a latch of FIG. 1.

Referring to FIG. 3, a block diagram of a particular embodiment of a latch 302, corresponding to the latch 102 of FIG. 1, is illustrated. The latch 302 includes a master storage circuit 304, a slave storage and retention circuit 306, an output circuit 308, and a restoration circuit 310. The latch 302 also includes an input labeled "D1", a voltage reference input labeled "VDDC", a voltage reference input labeled "VDD", a clock input labeled "CK", a clock input labeled "CK_B", a control input labeled "ISO", a control input labeled "ISO_B", and an output labeled "Q1."

The master storage circuit 304 includes an input connected to the input D1, an input connected to the input CK, an input connected to the input CK_B, and an output. The slave storage and retention circuit 306 includes an input connected to the output of the master storage circuit 304, an input connected to the input CK, an input connected to the input CK_B, an input connected to the input ISO, an input connected to the input ISO_B, an output labeled "QS", and an output labeled "QB." It will be appreciated that, for purposes of discussion, the slave storage and retention circuit 306 has been illustrated as a single circuit. In alternative embodiments, the slave circuit and the retention circuit are different circuits.

The restoration circuit 310 includes an input connected to the input ISO, an input connected to the input ISO_B, an input connected to the QS output of the slave storage and retention circuit 306, and an output labeled "QR." The output circuit 308 includes an input connected to the output QB of the slave storage and retention circuit 306 and connected to the output QR of the restoration circuit 310.

The master storage circuit is configured to store data provided at the input D1, and provide the stored data at the output, based on clock signals received via the CK and CK_B inputs. Accordingly, the master storage circuit is configured to be the master stage of a master-slave latch.

The slave storage and retention circuit is configured to store data provided by the master storage circuit 304 based on the clock signals received via the CK and CK_B inputs when an isolation signal received at the ISO input is in a first state (e.g. a negated state). Accordingly, when the isolation signal at the ISO input is in the first state, the slave storage and retention circuit 306 is configured to be the slave stage of the master-slave latch. When the isolation signal at the ISO input is in a second state (e.g. an asserted state), the slave storage and retention circuit 306 is configured to retain the stored data even when the voltage at the input VDD drops below a normal level.

The restoration circuit 310 is configured to provide the data stored by the slave storage and retention circuit 306 at the output QR when the isolation signal at the ISO input is in the second state and the voltage VDD is at a normal level. This ensures that the data stored at the slave storage and retention circuit 306 is provided to the output circuit 308 when the voltage at the VDD input is returned to a normal level from a low-power level, reducing the probability of delays in the isolation signal causing errors in downstream latches.

The output circuit 308 is configured to provide the data at the input as a logic signal at the output Q1. The output circuit 308 can include buffers, inverters, and other elements to provide the stored data at the appropriate logic level.

Figure 4:
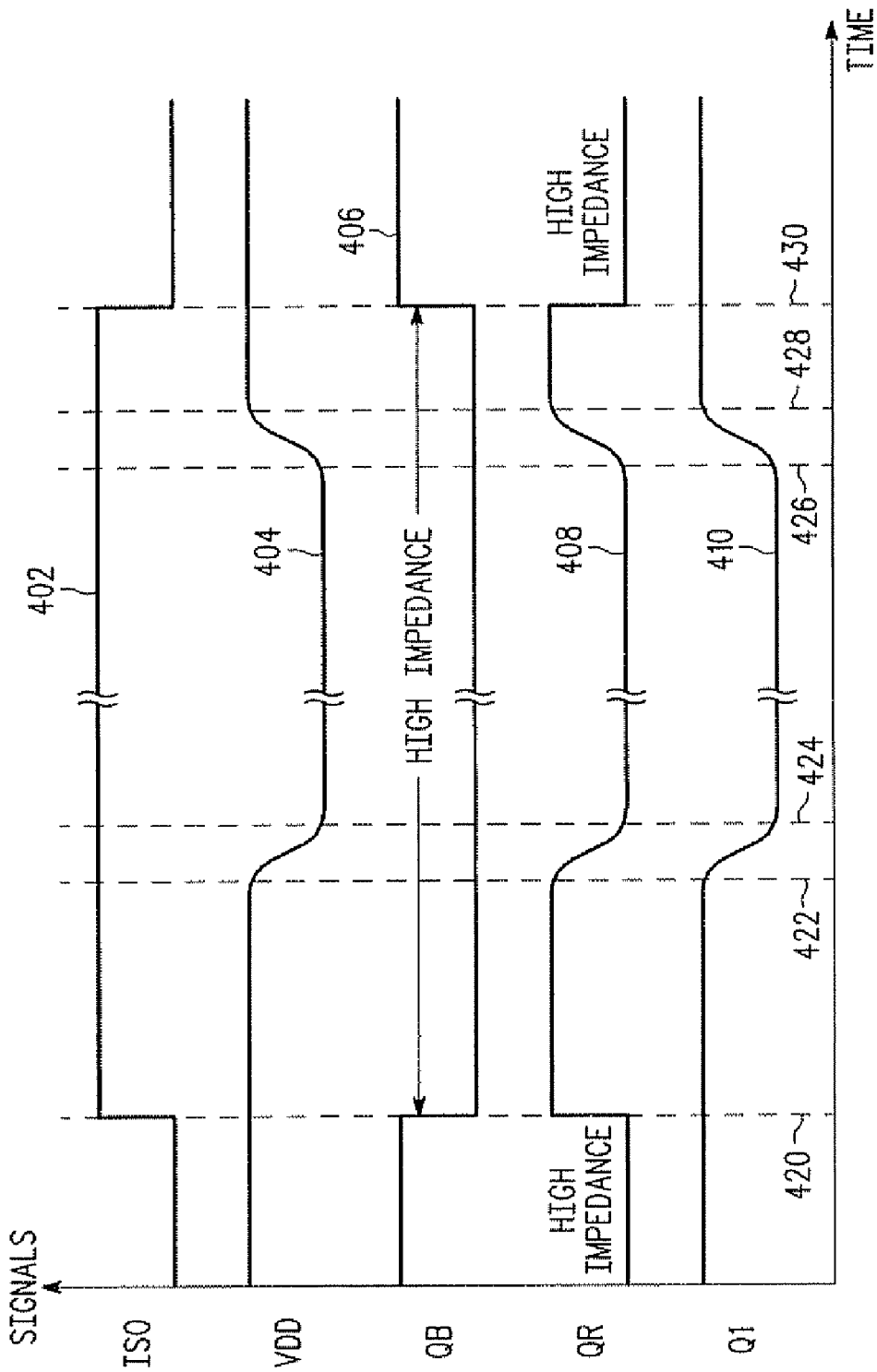
FIG. 4 is a diagram illustrating a particular embodiment of data and control signals for the latch of FIG. 3.

The operation of the latch 302 may be better understood with reference to FIG. 4. FIG. 4 illustrates a particular embodiment of signals associated with the latch 302. The curve 402 represents the signal at the ISO input of the latch 302. The curve 404 indicates the voltage level at the input VDD, while the curve 406 represents the signal at the output QB of the slave storage and retention circuit 306. The curve 408 represents the signal at the output QR of the restoration circuit 310 and the curve 410 indicates the signal at the output Q1 of the latch 302.

It will be appreciated that FIG. 4 reflects a configuration of the latch 302 where the output circuit 308 is a buffer. In other configurations, the output circuit 308 can be an inverter or other configuration of logic elements.

In operation, at time 420, the isolation signal at the ISO input is asserted, indicating that the integrated circuit 100 is preparing to enter the low-power mode and data stored at the latch 302 should be retained. As illustrated by curve 406, the value of the signal QB prior to time 420 is a logic high, indicating that a logic high value should be retained at the latch 302 and should be represented at the output Q1 when the integrated circuit 100 returns to the active mode.

Accordingly, in response to assertion of the isolation signal, data stored at the slave storage and retention circuit 306 is retained. As illustrated by the curve 406, when the isolation signal is asserted at time 420 the output QB does not remain at a logic high, as the isolation signal causes the output QB to become isolated from the retained data. Accordingly, the output QB enters a high impedance state at time 420. However, as illustrated by curve 408, at time 420 the restoration circuit 310 provides the retained data at the output QR, which previously was in a high impedance state. Accordingly, the output Q1 of the latch 302 remains at a logic high level due to the operation of the restoration circuit 310.

At time 422 the voltage at the input VDD begins dropping, indicating that the integrated circuit 100 is entering the low-power mode. In response, the output QR of the restoration circuit 310 and the signal Q1 also begin to drop. At time 424, the voltage at the VDD input, the output QR, and the signal Q1 have all fallen well below normal levels, so that the integrated circuit consumes less power when in the low-power mode. However, the slave storage and retention circuit continues to retain the stored data.

At time 426, the voltage at the VDD input begins rising, indicating that the integrated circuit 100 is returning to the active mode. In response, the output QR of the restoration circuit 310 also begins increasing, until at time 428 it is again providing the data retained at the slave storage and retention circuit to the output circuit 308. Accordingly, at time 428, the output Q1 of the latch 302 has been restored to represent the retained data. Thus, as illustrated, the retained data is provided via the output Q1 prior to negation of the isolation signal at time 430. In addition, in response to negation of the isolation signal the retained data is again provided via the output QB of the slave storage and retention circuit. Accordingly, in response to negation of the isolation signal at time 430 the output QR of the restoration circuit returns to the high impedance state.

Figure 5:
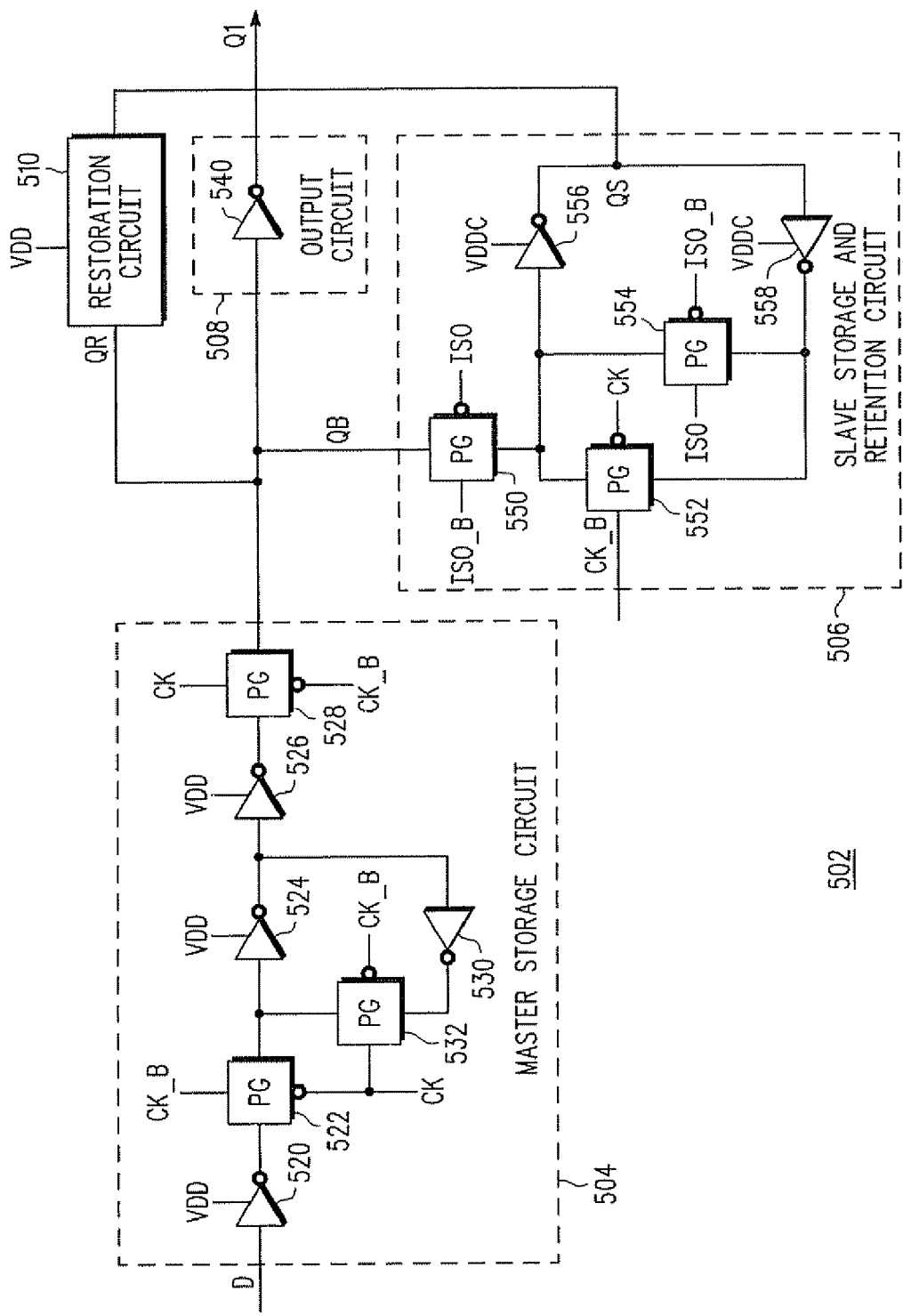
FIG. 5 is a combined circuit and block diagram of a particular embodiment of the latch of FIG. 3.

Referring to FIG. 5, a combined block and circuit diagram of a particular embodiment of a latch 502, corresponding to the latch 302 of FIG. 3, is illustrated. The latch 502 includes a master storage circuit 504, a slave storage and retention circuit 506, an output circuit 508, and a restoration circuit 510. The master storage circuit 504 includes inverters 520, 524, 526, and 530, and pass gates 522, 528, and 532. The inverter 520 includes an input connected to the input D of the latch 502 and an output. The pass gate 522 includes a control input connected to the CK input of the latch 502, a control input connected to the input CK_B of the latch 502, a terminal connected to the output of the inverter 520, and a second terminal. The inverter 524 includes an input connected to the second terminal of the pass gate 522, an output, and a voltage reference input connected to the input VDD of the latch 502. The inverter 526 includes an input connected to the output of the inverter 524, an output, and a voltage reference input connected to the input VDD of the latch 502. The pass gate 528 includes a control input connected to the CK input of the latch 502, a control input connected to the input CK_B of the latch 502, a terminal connected to the output of the inverter 526, and a second terminal. The inverter 530 includes an input connected to the output of the inverter 524 and an output. The pass gate 532 includes a control input connected to the CK input of the latch 502, a control input connected to the input CK_B of the latch 502, a terminal connected to the output of the inverter 530, and a terminal connected to the input of the inverter 524.

The slave storage and retention circuit 506 includes pass gates 550, 552, and 554, and inverters 556 and 558. The pass gate 550 includes a control input connected to the input ISO_B of the latch 502, a control input connected to the input ISO of the latch 502, a terminal QB connected to the second terminal of the pass gate 528, and a second terminal. The inverter 556 includes an input connected to the second terminal of the pass gate 550, an output connected to the output QS of the slave storage and retention circuit 506, and a reference voltage input connected to the voltage input VDDC of the latch 502. The inverter 558 includes an input connected to the output of the inverter 556, an output, and a reference voltage input connected to the voltage input VDDC of the latch 502. The pass gate 554 includes a control input connected to the input ISO, a control input connected to the input ISO_B, a terminal connected to the output of the inverter 558, and a terminal connected to the input of the inverter 556. The pass gate 552 includes a control input connected to the input CK_B, a control input connected to the input CK, a terminal connected to the output of the inverter 558, and a terminal connected to the input of the inverter 556.

The output circuit 508 includes a buffer 540. The buffer 540 includes an input connected to the second terminal of the pass gate 528 and an output connected to the output Q1 of the latch 502. The restoration circuit 510 includes an input connected to the output QS of the slave storage and retention circuit 506 and an output QR connected to the input of the buffer 540.

In operation, the master storage circuit 504 is configured to operate as the master stage of a master-slave latch when the integrated circuit 100 is in a normal mode and the voltage VDD is at a normal level. In addition, the slave storage circuit and retention circuit 506 is configured to operate as the slave stage of the master-slave latch when the isolation signal received at the ISO input is negated. The slave storage and retention circuit 506 is further configured to retain data stored at the slave storage circuit 506 when the isolation signal received at the ISO input is asserted. Because the reference voltage received via the voltage input VDDC does not change is in the low power mode, the slave storage and retention circuit 506 can retain the data until the integrated circuit 100 returns to the active mode.

The restoration circuit 510 is configured to apply the data retained at the slave storage and retention circuit 506 to the output circuit 508 when the isolation signal at the ISO input is asserted. This ensures that delays in negation of the isolation signal after the integrated circuit has returned to the active mode will not cause errors in downstream latches or other elements connected to the output Q1.

Figure 6:
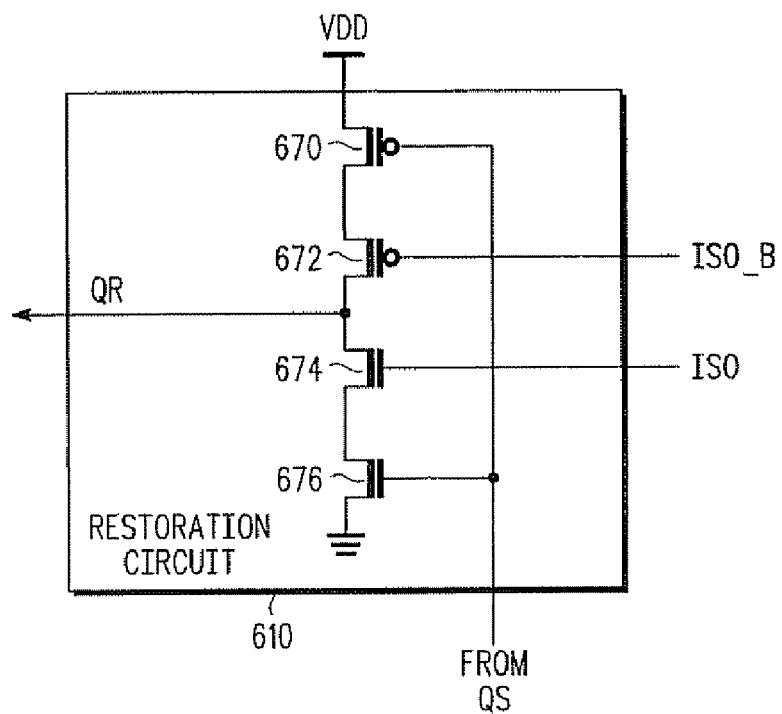
FIG. 6 is a circuit diagram of a particular embodiment of a restoration circuit of FIG. 1.

Referring to FIG. 6, a block diagram of a particular embodiment of a restoration circuit 610, corresponding to the restoration circuit 310 of FIG. 3, is illustrated. The restoration circuit 610 includes p-channel transistors 670 and 672 and n-channel transistors 674 and 676. The transistor 670 includes a first current electrode connected to the voltage reference input VDD of the latch 302, a second current electrode, and a control electrode connected to the output QS of the slave storage and restoration circuit 306. The transistor 672 includes a first current electrode connected to the second current electrode of the transistor 670, a second current electrode to provide the output QR, and a control electrode connected to the input ISO_B of the latch 302. The transistor 674 includes a first current electrode connected to the second current electrode of the transistor 672, a second current electrode, and a control electrode connected to the input ISO of the latch 302. The transistor 676 includes a first current electrode connected to the second current electrode of the transistor 674, a second current electrode connected to a ground voltage reference, and a control electrode connected to the output QS of the slave storage and retention circuit 306.

In operation, the control signals received via the ISO and ISO_B inputs control the conductivity of the current electrodes of the transistors 672 and 674 such that they are more conductive when the isolation signal at the ISO input is asserted. This causes the transistors 670 and 676 to apply an inverted representation of the data retained at the slave storage and retention circuit 306 to the output QR. Accordingly, the retained data is applied to the output circuit 308 when the isolation signal received at the ISO input is asserted. When the isolation signal is negated, there is no conductivity between the current electrodes of the transistors 672 and 674, so that the inverted representation of the output QS is not applied to the output QR.

Figure 7:
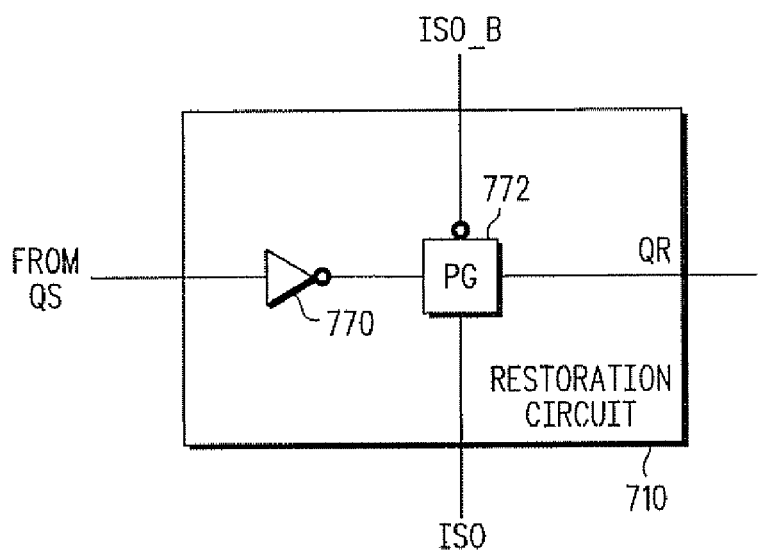
FIG. 7 is a combined circuit and block circuit diagram of an alternative embodiment of a restoration circuit of FIG. 1.

Referring to FIG. 7, a block diagram of a particular embodiment of a restoration circuit 710, corresponding to the restoration circuit 310 of FIG. 3, is illustrated. The restoration circuit 710 includes an inverter 770 and a pass gate 772. The inverter 770 includes an input connected to the output QS of the slave storage and retention circuit 306 and an output. The pass gate 772 includes a control input connected to the input ISO_B of the latch 302, a control input connected to the input ISO of the latch 302, a terminal connected to the output of the inverter 770, and a terminal connected to the output QR of the restoration circuit 710.

In operation, the control signals received via the ISO and ISO_B inputs control the conductivity between the terminals of the pass gate 772 such that it is conductive when the isolation signal is asserted. This causes the inverter 770 to apply an inverted representation of the data retained at the slave storage and retention circuit 306 to the output QR. Accordingly, the retained data is applied to the output circuit 308 when the isolation signal received at the ISO input is asserted. When the isolation signal is negated, there is no conductivity between the terminals of the pass gate 772, so that the inverted representation of the output QS is not applied to the output QR.

Figure 8:
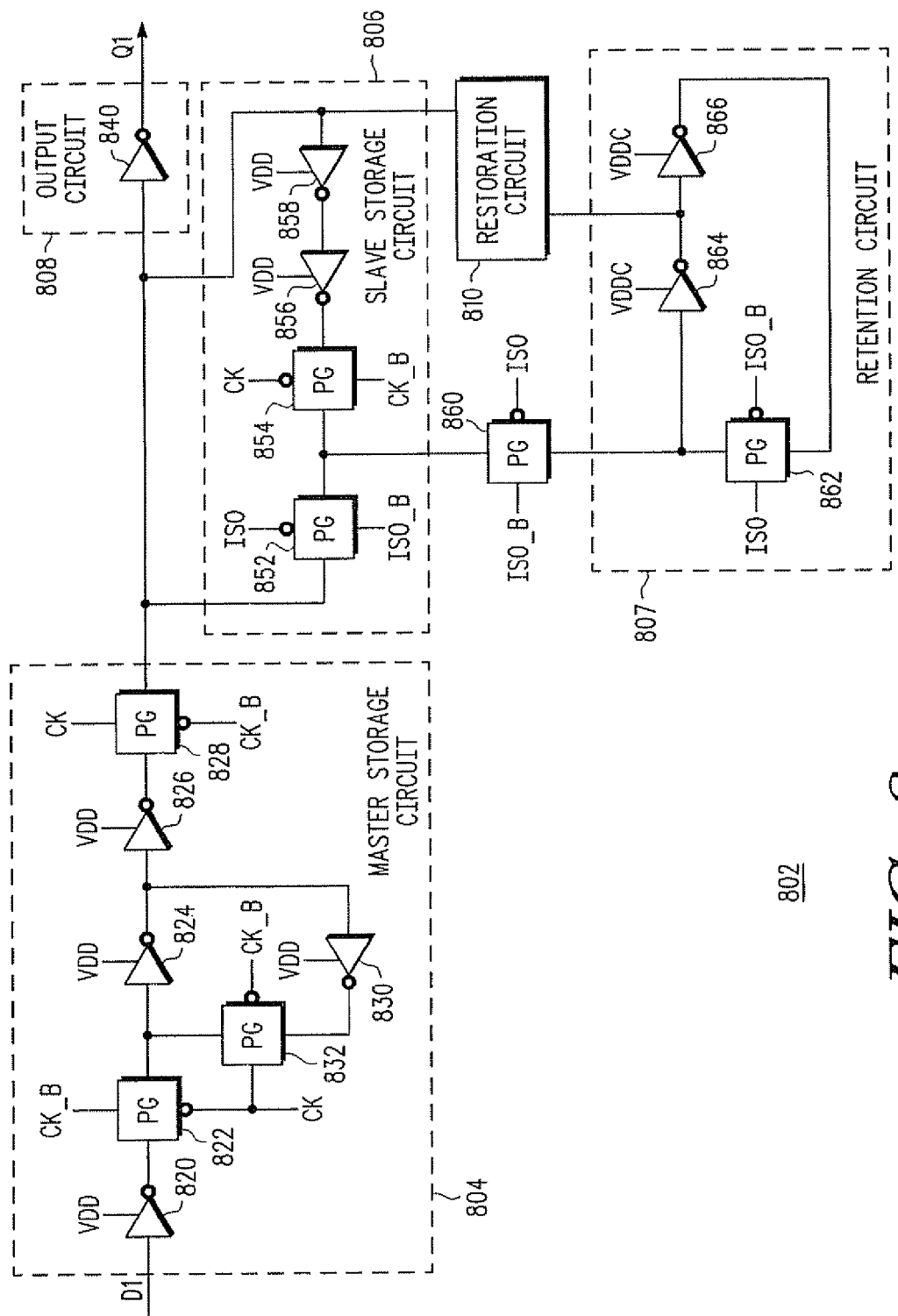
FIG. 8 is a combined circuit and block diagram of an alternative embodiment of a latch of FIG. 1.

Referring to FIG. 8, a combined block and circuit diagram of a particular embodiment of a latch 802, corresponding to the latch 102 of FIG. 1, is illustrated. The latch 802 includes a master storage circuit 804, a slave storage circuit 806, a retention circuit 807, an output circuit 808, a restoration circuit 810, and a pass gate 860.

The master storage circuit includes inverters 820, 824, 826, and 830, and pass gates 822, 828, and 832. The inverter 820 includes an input connected to the input D1 of the latch 802, an output, and a voltage reference input connected to the voltage input VDD of the latch 802. The pass gate 822 includes a control input connected to the input CK_B of the latch 802, a control input connected to the input CK of the latch 802, a first terminal connected to the output of the inverter 820, and a second terminal. The inverter 824 includes an input connected to the second terminal of the pass gate 822, an output, and a voltage reference input connected to the voltage input VDD of the latch 802. The inverter 826 includes an input connected to the output of the inverter 824, an output, and a voltage reference input connected to the voltage input VDD of the latch 802. The pass gate 828 includes a control input connected to the input CK of the latch 802, a control input connected to the input CK_B of the latch 802, a first terminal connected to the output of the inverter 826, and a second terminal. The inverter 830 includes an input connected to the output of the inverter 824, an output, and a voltage reference input connected to the voltage input VDD of the latch 802. The pass gate 832 includes a control input connected to the input CK of the latch 802, a control input connected to the input CK_B of the latch 802, a first terminal connected to the output of the inverter 830, and a second terminal connected to the input of the inverter 824.

The output circuit 808 includes an inverter 840. The inverter 840 includes an input connected to the second terminal of pass gate 828 and an output connected to the output Q1 of the latch 802.

The slave storage circuit includes inverters 856 and 858 and pass gates 852 and 854. The inverter 858 includes an input connected to the second terminal of the pass gate 828, an output, and a voltage reference input connected to the voltage input VDD of the latch 802. The inverter 856 includes an input connected to the output of the inverter 858, an output, and a voltage reference input connected to the voltage input VDD of the latch 802. The pass gate 854 includes a control input connected to the input CK of the latch 802, a control input connected to the input CK_B of the latch 802, a first terminal connected to the output of the inverter 856, and a second terminal. The pass gate 852 includes a control input connected to the input ISO of the latch 802, a control input connected to the input ISO_B of the latch 802, a first terminal connected to the second terminal of the pass gate 854, and a second terminal connected to the input of the inverter 840.

The restoration circuit 810 includes an input and an output connected to the input of the inverter 840. The restoration circuit 810 can be configured similarly to the restoration circuit 610 of FIG. 6, the restoration circuit 710 of FIG. 7, or otherwise appropriately configured. The pass gate 860 includes a control input connected to the input ISO_B of the latch 802, a control input connected to the input ISO of the latch 802, a first terminal connected to the second terminal of the pass gate 854, and a second terminal.

The retention circuit 807 includes inverters 864 and 866 and pass gate 862. The inverter 864 includes an input connected to second terminal of the pass gate 860, an output connected to the input of the restoration circuit 810, and a voltage reference input connected to the voltage input VDDC of the latch 802. The inverter 866 includes an input connected to the output of the inverter 864, an output, and a voltage reference input connected to the voltage input VDDC of the latch 802. The pass gate 862 includes a control input connected to the input ISO of the latch 802, a control input connected to the input ISO_B of the latch 802, a first terminal connected to the output of the inverter 866, and a second terminal connected to the second terminal of the pass gate 860.

In operation, the master storage circuit 804 is configured to operate as the master stage of a master-slave latch when the integrated circuit 100 is in a normal mode and the voltage VDD is at a normal level. In addition, the slave storage circuit 806 is configured to operate as the slave stage of the master-slave latch when the voltage VDD is at a normal level.

The pass gate 860 and the retention circuit 807 are configured to retain data stored at the slave storage circuit 806 when the isolation signal received at the ISO input is asserted. Because the reference voltage received via the voltage input VDDC does not change in the low power mode, the retention circuit 807 can retain the data until the integrated circuit 100 returns to the active mode. The restoration circuit 810 is configured to apply the data retained at the retention circuit 807 to the output circuit 808 when the isolation signal at the ISO input is asserted. This ensures that delays in negation of the isolation signal after the integrated circuit has returned to the active mode will not cause errors in downstream latches or other elements connected to the output Q1.

Other embodiments, uses, and advantages of the disclosure will be apparent to those skilled in the art from consideration of the specification and practice of the disclosure disclosed herein. As used herein, the terms "logic low" and "logic high" are used to represent a change in a signal between values, such as a charge value, and not only those values including positive and negative charges, but also charges having no charge value or effectively a zero charge value. It will further be appreciated that, although some circuit elements are depicted and described as connected to other circuit elements, the illustrated elements may also be coupled via additional circuit elements, such as resistors, capacitors, transistors, and the like. The specification and drawings should be considered exemplary only, and the scope of the disclosure is accordingly intended to be limited only by the following claims and equivalents thereof.

What is claimed is:

1. A device, comprising:
    a storage circuit comprising:
        a data input;
        a first control input;
        a first voltage reference input coupled to a first voltage reference, the storage circuit configured to store first data when the first voltage reference is at a first level;
        an output configured to provide the first data based on a signal at the first control input;
    a retention circuit configured to store the first data when the first voltage reference is at a second level whose magnitude is lower than the magnitude of the first level, the retention circuit comprising:
        a data input coupled to the output of the storage circuit;
        a second control input configured to receive a first isolation signal, the retention circuit configured to store the first data in response to assertion of the isolation signal;
        an output to provide the first data; and
    a restoration circuit, comprising:
        a data input coupled to the output of the retention circuit;
        a third control input configured to receive the first isolation signal; and
        an output coupled to the output of the storage circuit, the restoration circuit configured to couple the data input of the restoration circuit to the output of the storage circuit when the isolation signal is asserted.

2. The device of claim 1, wherein the restoration circuit further comprises:
    a second voltage reference input;
    an inverter comprising an input coupled to the data input of the restoration circuit, an output, and a third voltage input coupled to the second voltage reference input; and
    a pass gate comprising a first terminal coupled to the output of the inverter, a second terminal coupled to the output of the restoration circuit, and a control terminal coupled to the third control input.

3. The device of claim 1, wherein the restoration circuit further comprises:
    a second voltage reference input;
    a fourth control input configured to receive a second isolation signal;
    a first transistor comprising a first current electrode coupled to the second voltage reference input, a second current electrode, and a control electrode coupled to the data input of the restoration circuit;
    a second transistor comprising a first current electrode coupled to the second current electrode of the first transistor, a second current electrode coupled to the output of the restoration circuit, and a control electrode coupled to the third control input;
    a third transistor comprising a first current electrode coupled to the output of the restoration circuit, a second current electrode, and a control electrode coupled to the fourth control input; and
    a fourth transistor comprising a first current electrode coupled to the second current electrode of the third transistor, a second current electrode coupled to a third voltage reference, and a control electrode coupled to the data input of the restoration circuit.

4. The device of claim 1, wherein the storage circuit comprises a master stage of a master-slave flip-flop.

5. The device of claim 4, wherein the retention circuit comprises a slave stage of the master-slave flip-flop.

6. The device of claim 1, wherein the retention circuit further comprises a third voltage reference input coupled to a second voltage reference.

7. The device of claim 6, wherein the second voltage reference remains at a level sufficient for the retention circuit to store the first data when the first voltage reference is in a low-power mode.

8. The device of claim 1, wherein the retention circuit comprises:
    a first pass gate comprising a first terminal coupled to the input of the retention circuit, a second terminal, and a control terminal coupled to the second control input;
    a second pass gate comprising a first terminal coupled to the second terminal of the first pass gate, a second terminal, and a control terminal coupled to the first control input;
    a third pass gate comprising a first terminal coupled to the second terminal of the first pass gate, a second terminal coupled to the second terminal of the second pass gate, and a control terminal coupled to the second control input;
    a first inverter comprising an input coupled to the second terminal of the first pass gate and an output coupled to the output of the retention circuit;
    a second inverter comprising an input coupled to the output of the first inverter and an output coupled to the second terminal of the third pass gate.

9. The device of claim 1, wherein the storage circuit comprises:
    a master stage comprising an input coupled to the data input, a fourth control input coupled to the first control input, and an output, the master stage configured to store data at the data input in response to assertion of a signal at the fourth control input; and
    a slave stage comprising an input coupled to the output of the master stage, a fifth control input coupled to the first control input, and an output coupled to the input of the retention circuit, the slave stage configured to store data at the input of the slave stage in response to negation of a signal at the fifth control input.

10. The device of claim 1, wherein the retention circuit comprises:
    a pass gate comprising a first terminal coupled to the data input of the retention circuit, a second terminal, and a control terminal coupled to the second control input;
    a first inverter comprising an input coupled to the data input of the retention circuit and an output coupled to the output of the retention circuit; and a second inverter comprising an input coupled to the output of the retention circuit and an output coupled to the second terminal of the pass gate.

11. The device of claim 1, wherein the storage circuit comprises:
   a first inverter comprising an input coupled to the data input and an output;
   a first pass gate comprising a first terminal coupled to the output of the first inverter, a second terminal, and a control terminal coupled to the first control input;
   a second inverter comprising an input coupled to the second terminal of the first pass gate and an output;
   a third inverter comprising an input coupled to the output of the second inverter and an output; and
   a second pass gate comprising a first terminal coupled to the output of the third inverter, a second terminal coupled to the input of the second inverter, and a control terminal coupled to the first control input.

12. The device of claim 11, wherein the storage circuit further comprises:
   a fourth inverter comprising an input coupled to the output of the second inverter and an output; and
   a third pass gate comprising a first terminal coupled to the output of the fourth inverter, a second terminal coupled to the output of the device, and a control terminal coupled to the first control input.

13. The device of claim 12, wherein the storage circuit further comprises a fourth pass gate comprising a first terminal coupled to the second terminal of the third pass gate, a second terminal, and a control terminal coupled to the second control input.

14. The device of claim 13, wherein the retention circuit further comprises:
   a fifth pass gate comprising a first terminal coupled to the second terminal of the fourth pass gate, a second terminal, and a control terminal coupled to the first control input;
   a sixth pass gate comprising a first terminal coupled to the second terminal of the fourth pass gate, a second terminal coupled to the second terminal of the fifth pass gate, and a control terminal coupled to the second control input;
   a fifth inverter comprising an input coupled to the second terminal of the fourth pass gate and an output; and
   a sixth inverter comprising an input coupled to the output of the fifth inverter and an output coupled to the second terminal of the fifth pass gate.

15. The device of claim 13, wherein the storage circuit further comprises:
   a fifth pass gate comprising a first terminal coupled to the second terminal of the fourth pass gate, a second terminal coupled to the data input of the retention circuit, and a control terminal coupled to the first control input;
   a fifth inverter comprising an input coupled to the first terminal of the fourth pass gate and an output; and
   a sixth inverter comprising an input coupled to the output of the fifth inverter and an output coupled to the data input of the retention circuit.

16. A method, comprising:
   receiving a first voltage at a reference voltage input of a latch at a first time;
   receiving an asserted isolation signal at the first time;
   storing data at a first stage of the latch at the first time in response to the asserted isolation signal;
   receiving a second voltage at the reference voltage input at a second time, the second time after the first time;
   receiving the first voltage at the reference voltage input at a third time, the third time after the second;
   providing the data stored at the first stage of the latch from a restoration stage of the latch to an output of the latch in response to receiving the first voltage at the third time;
   de-asserting the isolation signal at a fourth time, the fourth time after the third time, the output of latch maintaining a state in response to the de-asserted isolation signal.

17. The method of claim 16, wherein the first stage of the latch is a slave stage of a master-slave flip-flop.

18. The method of claim 16, wherein the second voltage is smaller in magnitude than the first voltage.

19. A method, comprising:
   storing data at a first stage of a latch of an integrated circuit when the integrated circuit is in a first power mode;
   providing the data stored at the first stage via a first signal path to an output of the latch when the integrated circuit is in an active mode;
   maintaining the data stored at the first stage of the latch when the integrated circuit is in a second power mode; and
   providing the data maintained at the latch to the output of the latch via a second signal path not including the first stage of the latch in response to a signal indicating the integrated circuit is in the second power mode.

20. The method of claim 19, wherein the second power mode is a low power mode.

* * * * *